(12) United States Patent
Gillingham et al.

(10) Patent No.: US 6,522,596 B2
(45) Date of Patent: Feb. 18, 2003

(54) SEARCHLINE CONTROL CIRCUIT AND POWER REDUCTION METHOD

(75) Inventors: Peter B. Gillingham, Kanata (CA); Abdullah Ahmed, Scarborough (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 09/892,735

(22) Filed: Jun. 28, 2001

(65) Prior Publication Data

US 2002/0015348 A1 Feb. 7, 2002

(30) Foreign Application Priority Data

Jun. 30, 2000 (CA) .............................................. 2,313,275

(51) Int. Cl.[7] ................................................. G11C 7/00
(52) U.S. Cl. ....................................... 365/227; 365/154
(58) Field of Search ................................ 365/227, 154, 365/189.07, 189.08, 203, 205, 189.05

(56) References Cited

U.S. PATENT DOCUMENTS 4,845,668 A * 7/1989 Sano et al. .................... 365/49
5,471,189 A * 11/1995 Dietz et al. ................ 340/146.2
6,400,594 B2 * 6/2002 Hata et al. ............... 365/189.07

FOREIGN PATENT DOCUMENTS

CA    2266062    3/1999

* cited by examiner

*Primary Examiner*—Michael S. Lebentritt
*Assistant Examiner*—Anh Phung
(74) *Attorney, Agent, or Firm*—L. Anne Kinsman; Borden Ladner Gervais LLP

(57) ABSTRACT

A system and method for reduction of power consumed by a searchline buffer and control circuit during a CAM search-and-compare operation. The data buffer circuit samples one bit of a search word and a mask bit for driving a pair of complementary searchlines with the appropriate logic levels. The complementary searchlines are precharged to a mid-point voltage level between the high logic level voltage and the low logic level voltage during a precharge phase. The mid-point voltage level is applied on each searchline by sharing charge from the searchline at the high logic level voltage with the searchline at the low logic level voltage. Additional control logic compares the searchline data of the current search-and-compare operation with the next search-and-compare operation, to inhibit searchline precharging when both searchline data are at the same logic level.

34 Claims, 11 Drawing Sheets

SEARCHLINE CONTROL CIRCUIT AND POWER REDUCTION METHOD

FIELD OF THE INVENTION

The present invention relates to content addressable memory (CAM). In particular, the present invention relates to a circuit and method for reducing power consumption of search lines and match lines in a CAM device.

BACKGROUND OF THE INVENTION

In many conventional memory systems, such as random access memory, binary digits (bits) are stored in memory cells, and are accessed by a processor that specifies a linear address that is associated with the given cell. This system provides rapid access to any portion of the memory system within certain limitations. To facilitate processor control, each operation that accesses memory must declare, as a part of the instruction, the address of the memory cell/cells required. Standard memory systems are not well designed for a content based search. Content based searches in standard memory require software based algorithmic search under the control of the microprocessor. Many memory operations are required to perform a search. These searches are neither quick nor efficient in using processor resources.

To overcome these inadequacies an associative memory system called Content Addressable Memory (CAM) has been developed. CAM allows cells to be referenced by their contents, so it has first found use in lookup table implementations such as cache memory subsystems and is now rapidly finding use in networking systems. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated on a matchline, indicating whether the search word matches a stored word or not.

A typical CAM block diagram is shown in FIG. 1. The CAM 10 includes a matrix, or array 100, of CAM cells (not shown) arranged in rows and columns. For a ternary CAM, the cells are typically either DRAM or SRAM type, and store one of three'states: logic "1", logic "0" and "don't care", as two bits of data. A predetermined number of CAM cells in a row store a word of data. An address decoder 12 is used to select any row within the CAM array 100 to allow data to be written, via write data register 17, into or read out of the selected row. Although most commonly, data is written or loaded into the CAM and searched. Data access circuitry such as bitlines and column selection devices, are located within the array 100 to transfer data into and out of the array 100. The comparand, mask registers 15, search data register 500 and write data registers 17 receive data from the data I/O block 20. Located within CAM array 100 for each row of CAM cells are matchline sense circuits (not shown). The matchline sense circuits are used during search-and-compare operations for outputting a result indicating a successful or unsuccessful match of a search word against the stored word in the row. The results for all rows are processed by the priority encoder 400 to output the address (Match Address) corresponding to the location of a matched word. The match address is stored in match address registers 300 before being output by the match address output block 26. Since it is possible that more than one row will match the search word, the priority encoder 400 generates the highest priority address corresponding to a matched word. Search data register 500 is responsible for asserting search word data onto the searchlines within the array 100. Each search data register 500 receives its respective data signals (not shown), for driving one bit of the search word data onto a pair of complementary searchlines. Additional components of the CAM include the control circuit block 14, the flag logic block 16, the voltage supply generation block 18, various control and address registers 22 and a refresh counter 28.

CAM cells are generally either SRAM based cells or DRAM based cells. Until recently, SRAM based CAM cells have been most common because of their speed and compatibility with standard logic processes. However, to provide ternary CAMs, i.e. CAMs having cells which store one of three possible states: a "0", "1" or "don't care", ternary SRAM based cells typically require many more transistors compared to a typical DRAM based cell of six transistors. As a result, ternary SRAM based CAMs have a much lower packing density than ternary DRAM cells. FIG. 2 shows a typical ternary DRAM type CAM cell 101 as described in Canadian Patent Application No. 2,266,062, filed Mar. 31, 1999, the contents of which are incorporated herein by reference. Cell 101 has a comparison circuit which includes an n-channel search transistor 102 connected in series with an n-channel compare transistor 104 between a matchline ML and a tail line TL. A search line SL is connected to the gate of search transistor 102. The storage circuit includes an n-channel access transistor 106 having a gate connected to a wordline WL and connected in series with capacitor 108 between bitline BL and a cell plate voltage potential VCP. Charge storage node CELL1 is connected to the gate of compare transistor 104 to turn on transistor 104 if there is charge stored on capacitor 108 i.e. if CELL1 is logic "1". The remaining transistors and capacitor replicate transistors 102, 104, 106 and capacitor 108 for the other half of the ternary data bit, and are connected to corresponding lines SL* and BL* and are provided to support ternary data storage. Together they can store a ternary value representing logic "1", logic "0", or "don't care".

| Ternary Value | CELL1 | CELL2 |
|---|---|---|
| 0 | 0 | 1 |
| 1 | 1 | 0 |
| "Don't Care" | 0 | 0 |

Lines SL, SL*, BL and BL* are common to all cells of the column, and lines ML, TL and WL are common to all cells of a word in the row. The tail line TL is typically connected to ground and all the transistors are n-channel transistors. The description of the operation of the ternary DRAM cell is detailed in the aforementioned reference.

FIG. 3 shows a typical SRAM cell of the prior art used to implement the ternary CAM cell. The SRAM type CAM cell of FIG. 3 includes a CMOS cross-coupled latch connected to a pair of bitlines via access transistors. The cross-coupled latch consists of p-channel transistors 110 and 111, and n-channel transistors 112 and 113, where p-channel transistor 110 and n-channel transistor 112, and p-channel transistor 111 and n-channel transistor 113, form respective complimentary pairs connected in series between the VDD voltage supply and ground. N-channel access transistor 114 couples bitline BL to the shared source-drain of transistors 110 and 112, and n-channel access transistor 115 couples bitline BL* to the shared source-drain of transistors 111 and 113. The gates of access transistors 114 and 115 are connected to a common wordline WL for the row. A single output line 116 connects the shared source-drain of transistors 111 and 113 to the comparison circuit of FIG. 4. Since the CAM cell of FIG. 3 only stores one bit of information, a second identical circuit would be required to store a second bit of information in order to provide ternary data storage. It will be apparent to one skilled in the art that a ternary SRAM type CAM cell is implemented with many more transistors than the previously discussed ternary DRAM type CAM cell shown in FIG. 2. FIG. 4 shows a ternary comparison circuit of the prior art used with the ternary SRAM type CAM cell previously discussed in FIG. 3. The circuit compares stored CAM cell data against searchline data, and discharges a precharged matchline to indicate the mis-match condition. Otherwise, the precharged matchline remains at the precharge voltage to indicate the match condition. The ternary comparison circuit of FIG. 4 consists of n-channel compare transistors 120 and 122 connected in series between searchlines SL and SL*, and n-channel diode connected transistor 118 coupling the matchline ML to the shared source-drain of n-channel compare transistors 120 and 122. Although the combination of the ternary SRAM type CAM cell with the ternary comparison circuit is more commonly used in conventional CAM arrays, substitution with the ternary DRAM type CAM cell of FIG. 2 will significantly reduce the area of the array.

To search the ternary DRAM CAM cell of FIG. 2 for example, the searchlines SLj and SLj* are required to carry three logic level combinations: "LOW,HIGH" and "HIGH, LOW" to represent the "0" and "1" data states respectively, and "LOW,LOW" to represent the "don't care" or mask state. With the exception of the mask state, during any search-and-compare operation, at least one searchline of a pair of searchlines will be at the high logic level of VDD and the other searchline will be at the low logic level of ground. For a match condition to occur between search and stored data, there must be no conduction path between ML and TL, whereas for a mis-match condition, conduction will occur between ML and TL. If a "don't care" is stored in a cell, that cell will be unable to form a connection between ML and TL, regardless of the data presented on the searchlines, and thus will not affect the outcome of the word compare operation. The discharge path between ML and TL is formed when at least one pair of search and compare transistors, such as transistors 102 and 104 for example, are turned on. Power consumption is a critical issue in CAM's because, unlike RAMs, each cell in a CAM is active on every search cycle, using significant power for charging and discharging both matchlines and searchlines. In conventional CAMs for example, all searchlines are held at the low logic level of ground during the precharge phase. In the active phase, the appropriate searchlines are driven to the high logic level of VDD. When the comparison between the stored words and the search word is completed, the precharge phase is entered and all searchlines are grounded in preparation for the next search-and-compare operation. This scheme suffers from high power consumption because searchlines are cycled between VDD and ground for every search-and-compare operation. Since it is possible that successive search words do not change substantially, i.e. only single bit changes, considerable power is unnecessarily consumed when the same searchlines are grounded and then driven back to VDD for the next search-and-compare operation.

New techniques for saving matchline power is disclosed in commonly owned application Ser. No. 2,307,240 filed May 1, 2000, the contents of which are incorporated herein by reference. However, overall power consumption of conventional CAM is still high due to the requirement for cycling the searchlines as previously discussed.

An improved searchline control circuit developed for the matchline sense circuit in U.S. Pat. No. 2,307,240 is shown in FIG. 8, and discussed in more detail later. This searchline control circuit latches the search data, keeping the pair of searchlines at either one of the "LOW,HIGH", "HIGH, LOW" and "LOW,LOW" states during a search-and-compare operation. In a subsequent search-and-compare operation, new search data is latched, and the pair of searchlines either remains in the same state or is driven to a different state. In this scheme, only searchlines with new data change states, thereby reducing the power consumption as compared to previous searchline control schemes. However, when search data changes from one data state to the other data state ("0" to "1", or "1" to "0") the voltage levels on the corresponding pair of searchlines must change to their opposite polarities. If the searchline capacitance is charged or discharged in one cycle, then the worst case power dissipation in each searchline is given by the equation:

$$P = C_{SL} \times V^2 \times (f/2)$$

Where $C_{SL}$ is the capacitance of the search line, V is the supply voltage and f is the search frequency. Hence, power consumption is still relatively high due to the rail-to-rail voltage changes in the searchlines. Additionally, larger CAM arrays employing longer searchlines will add more parasitic capacitance which must be overcome by the searchline control circuits.

It is therefore desirable to provide a searchline control circuit capable of consuming very little power and operating at high speed.

SUMMARY OF THE INVENTION

It is an object of the present invention to obviate or mitigate at least one disadvantage of previous searchline control circuits and methods. In particular, it is an object of the present invention to provide a searchline control circuit and method of operation that has reduced power consumption and that operates at high speed.

In a first aspect, the present invention provides a control circuit for reducing power consumption in first and second signal lines in a semiconductor device. The circuit includes a data buffer, first and second coupling circuits, and an equalizing circuit. The data buffer drives data on the first and second signal lines. The first and second coupling circuits disconnect the first and second signal lines, respectively, from the data buffer in response to an enable signal. The equalizing circuit shorts the pair of complementary signal lines together in response to the enable signal.

In one embodiment, the data buffer includes a latch circuit and a drive circuit. The latch circuit receives a data signal, a mask signal and a control signal, and provides, in response to the control signal, a first output corresponding to the data signal, and a second output corresponding to the mask signal. The drive circuit receives the first output and the second output, and generates data on the first and second signal lines. In this embodiment, the drive circuit includes a first logic gate and a second logic gate. The first logic gate receives the first output and the second output from the latch circuit, and generates a first data logic level on the first signal line. The second logic gate receives an inverted first output and the second output, and generates a second data logic level on the second signal line.

In further embodiments of the control circuit of the present invention, the first and second coupling circuits can include tri-state buffers or transmission gates. The equalizing circuit includes a logic circuit, and a transmission gate, and can include a transistor of either n-type or p-type. The logic circuit generates the enable signal. In a further aspect of this embodiment, the logic circuit generates the enable signal when the data and new data are different.

In a further aspect of the present invention, there is provided a control circuit for reducing searchline power consumption in a content addressable memory. The circuit includes a flip-flop, coupling circuit, enabling circuit and an equalizing circuit. The flip-flop receives search data and provides first and second search data outputs. The coupling circuit couples the first and second search data outputs to first and second searchlines. The enabling circuit selectively enables the coupling circuit to pass the first and second data outputs to the first and second searchlines in response to a precharge signal. The equalizing circuit connects the first and second searchlines together in response to the precharge signal.

In further embodiments of the control circuit of the present invention, the flip-flop can be a D-type flip-flop which receives mask data and a clock signal. The D-type flip-flop latches the search data and the mask data and provides the first and second search data outputs in response to a rising edge of the clock signal. In a further aspect of this embodiment, the coupling circuit includes a first logic gate, a second logic gate and first and second buffers. The first logic gate receives the first and second search data outputs for generating the first intermediate search data output. The second logic gate receives an inverted first search data output and the second search data output for generating a second intermediate data output. The first and second buffers selectively couple the first and second intermediate data outputs to the first and second searchlines respectively. In a further aspect of this embodiment, the first and second buffers can be tri-state buffers or transmission gates, and the equalizing circuit can be either an n-type transistor or a p-type transistor. In yet another further aspect of this embodiment, the enabling circuit includes a logic circuit for receiving the search data and the first search data output to enable the equalizing circuit when the search data and the first search data output are different, in response to the precharge signal.

In a further aspect of the present invention, there is provided a content addressable memory. The content addressable memory consists of an array of content addressable memory cells arranged in rows and columns, an address decoder, write data circuitry, search data circuitry, matchline sense circuitry, and a searchline control circuit. The address decoder addresses rows of cells. The write data circuitry writes data to the cells. The search data circuitry writes search data onto pairs of searchlines. The matchline sense circuitry compares data stored in the cells to the search data on the pairs of searchlines. The searchline control circuit selectively equalizes the pairs of searchlines during a precharge phase. In a further aspect of this embodiment, the matchlines and tail lines of the matchline sense circuitry are equalized during the precharge phase.

In a presently preferred embodiment, the present invention provides a control circuit for reducing searchline power consumption in a content addressable memory. This control circuit preferably consists of a flip flop for latching a search data signal and a mask data signal in response to a clock signal, and for providing first and second search data outputs. A first inverter receives first search data output to provide an inverted search data output. A first logic gate receives the inverted search data output and the second search data output, to provide a first intermediate search data output, while a second logic gate receives the first search data output and the second search data output, to provide a second intermediate search data output. A third logic gate receives the clock signal, and a precharge signal, to provide an equalization signal. A second inverter receives equalization signal to provide an enable signal. A first buffer circuit selectively couples the first intermediate search data output to a first searchline in response to the enable signal while a second buffer circuit selectively couples the second intermediate search data output to a second searchline in response to the enable signal. A transistor has a source connected to the first searchline, a drain connected to the second searchline and a gate connected to the equalization signal. Preferably, the first and second logic gates are NOR gates, and the first and second coupling circuits are either tri-state buffers, or transmission gates. The transistor can be an n-type or p-type transistor.

In a further aspect, the present invention provides a method for precharging first and second complementary signal lines in a content addressable memory. The method consists of latching search data during a precharge cycle; driving the first and second complementary signal lines with the latched search data during an active cycle; and equalizing the first and second complementary signal lines before latching new search data in a subsequent precharge cycle. The first and second signal lines can be driven to complementary data logic levels, or to the same logic levels. Generally, the first and second signal lines are equalized to a mid-point voltage level between a high logic voltage level, such as VDD, and a low logic voltage level, such as ground. In a further aspect of this embodiment, equalization of the first and second complementary signal lines is disabled when the search data and the new search data are at the same logic levels.

In yet another preferred embodiment, the present invention provides a control circuit for reducing searchline power consumption in a content addressable memory. This control circuit preferably consists of a flip flop for latching a search data signal and a mask data signal in response to a clock signal, and for providing first and second search data outputs. A first inverter receives first search data output to provide an inverted search data output. A first logic gate receives the inverted search data output and the second search data output, to provide a first intermediate search data output, while a second logic gate receives the first search data output and the second search data output, to provide a second intermediate search data output. A third logic gate receives the clock signal, and a precharge signal, to provide an intermediate control signal. A second inverter receives the intermediate control signal to provide an enable signal. A first buffer circuit selectively couples the first intermediate search data output to a first searchline in response to the enable signal while a second buffer circuit selectively couples the second intermediate search data output to a second searchline in response to the enable signal. A fourth logic gate receives the search data and the first search data output to provide a second intermediate control signal. A fifth logic gate receives the second intermediate control signal and the enable signal to provide an equalization signal. A transistor has a source connected to the first searchline, a drain connected to the second searchline and a gate connected to the equalization signal.

In a further aspect of the present invention, there is provided a control circuit for reducing searchline power consumption in a content addressable memory. The circuit includes a flip-flop, coupling circuit, enabling circuit, an equalizing circuit and a logic circuit. The flip-flop receives search data and provides first and second search data outputs. The coupling circuit couples the first and second search data outputs to first and second searchlines. The enabling circuit selectively enables the coupling circuit to pass the first and second data outputs to the first and second searchlines in response to a precharge signal. The equalizing circuit is connected between the first and second searchlines. The logic circuit receives the search data and the first search data output to enable the equalizing circuit, in response to the precharge signal, when the search data is different from the search data output.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 5:
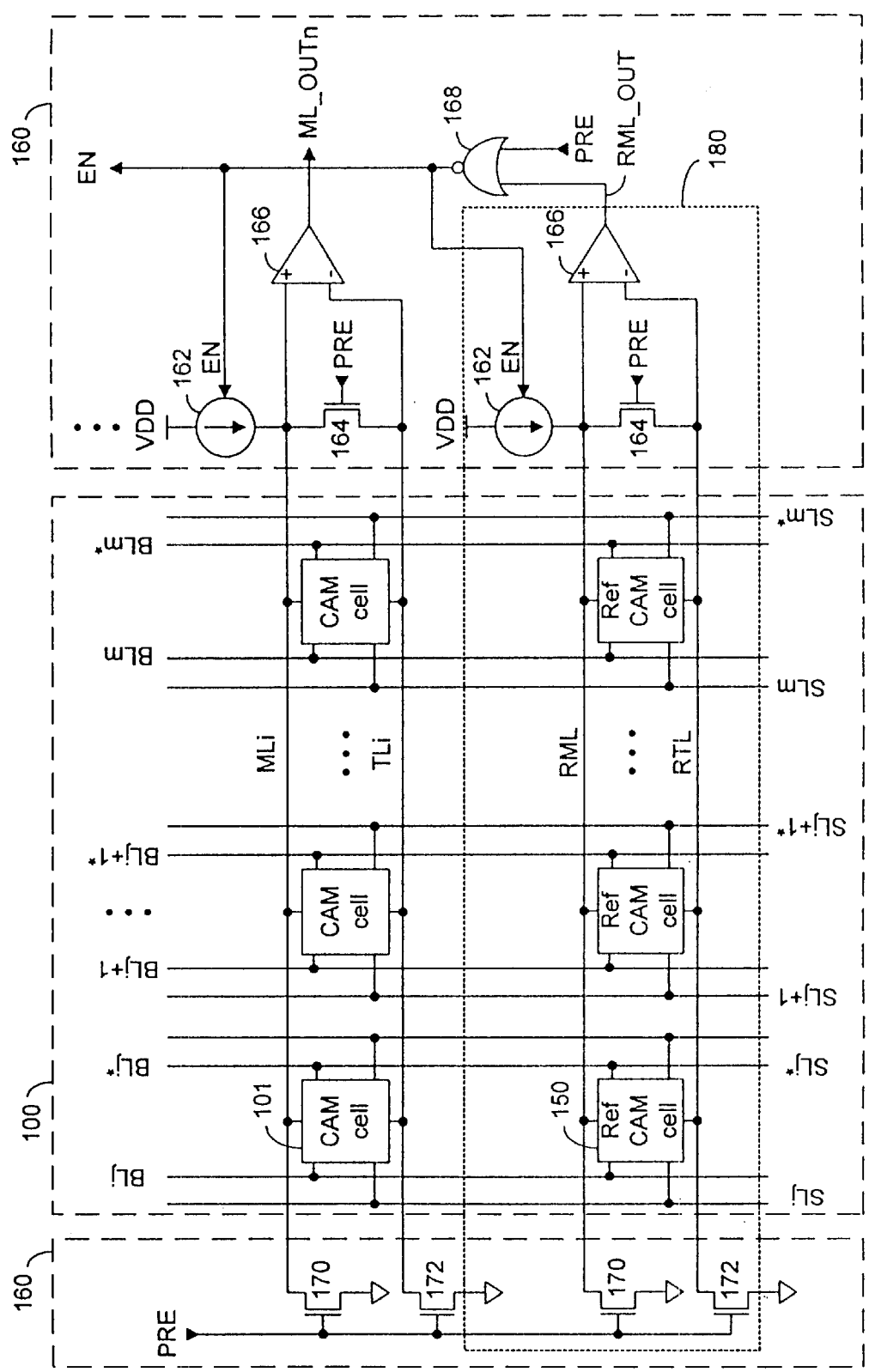
FIG. 5 shows a block diagram of the CAM array and matchline sense circuit block of FIG. 1.

A detailed hierarchical view of the CAM array 100 is shown in FIG. 5. Only the two last logical rows of the array 100 and matchline sense circuitry 160 are shown, and wordlines WL are intentionally omitted to simplify the schematic of FIG. 5. But it will be understood by those skilled in the art that typically, wordlines would run in parallel to the matchlines and each wordline would connect to all cells in that particular row. For ease of illustration, matchline sense circuitry 160 has been split in to two portions at either side of array 100. Array 100 includes CAM cells 101, reference CAM cells 150, bitlines BLj, complementary bitlines BLj*, searchlines SLj, complementary searchlines SLj*, matchlines MLi, tail lines TLi, reference matchline RML and reference tail line RTL. CAM cells 101 and 150 of the CAM array 100 are arranged in rows and columns. CAM cells 101 of a row are connected to a common matchline MLi, and tail line TLi, and CAM cells 101 of a column are connected to a common pair of search lines SLj/SLj* and a common pair of bitlines BLj/BLj*, where i is an integer value between 0 and n, and j is an integer value between 0 and m. The second row of the array 100 is a reference row 180, having dummy elements constructed and arranged identically to the elements of the regular row above it. Reference CAM cells 150 are connected to RML and RTL and are configured such that they never form a conduction path between RML and RTL and therefore will not affect the outcome of a compare operation.

Each matchline sense circuit from matchline sense circuitry 160 includes a current source 162, an n-channel shorting transistor 164, a comparator circuit 166, and n-channel precharge transistors 170 and 172. Current source 162 connected to VDD applies current to its respective matchline MLi in response to control signal EN, for raising the voltage potential of the matchline MLi. Precharge transistors 170 and 172 couple each matchline MLi and tail line TLi to ground respectively, and every matchline MLi and tail line TLi are coupled together via n-channel transistor 164, where the gates of n-channel transistors 170, 172 and 164 are connected to a precharge signal PRE. Although not shown in FIG. 1, precharge signal PRE is an internal CAM signal generated by the control logic block 14. Shorting transistor 164 shares the charge between the matchline MLi and tail line TLi to facilitate the precharging of MLi and TLi to ground. Matchlines MLi and tail lines TLi are connected to their respective comparator circuits 166, where each comparator circuit 166 generates a signal ML_OUTi. Signal EN is generated from NOR gate 168, and is received by all current sources 162. The matchline sense circuit for the reference row 180 is constructed similarly to the matchline sense circuit described above, however, signal RML_OUT from comparator 166 of reference row 180 is connected to one input of NOR gate 168, and the other input of NOR gate 168 is connected to precharge signal PRE.

In general, the matchline sense circuits are self-timed to reduce power consumption of the CAM chip. After a matchline MLi and tail line TLi is precharged to ground by precharge transistor 170, a search word is asserted on the searchlines SLj and the current source 162 on matchline MLi turns on. If any cell 101 on the matchline MLi has a mismatch condition, MLi and TLi are shorted together and comparator 166 generates a low logic level output. If all cells of a word have a match condition, there will be no conduction path from MLi to TLi so a voltage potential develops and comparator 166 generates a high logic level output. Reference matchline RML has reference cells 150 in which internal storage nodes are hardwired to "0", such that there can never be a current path between the matchline and the tail line and therefore it always generates a match. The reference matchline sense circuit detects when the RML potential exceeds a certain predetermined voltage level, in order to disable all the other current sources. In this way, each matchline ML receives just enough current to detect a match condition, but no more, saving substantial power.

Figure 6:
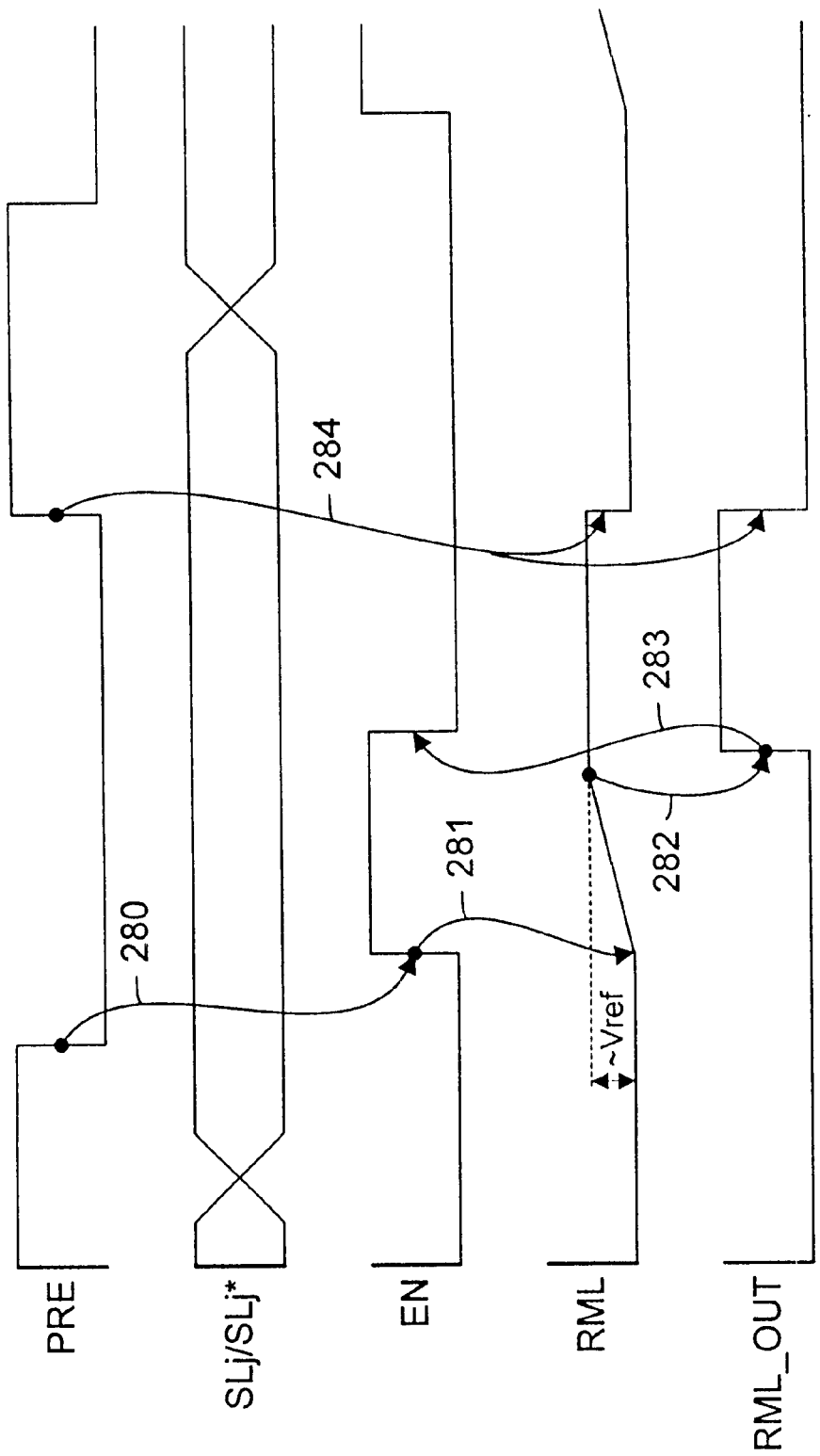
FIG. 6 shows a sequence diagram of the operation of the matchline sense circuit of FIG. 5.

The operation of the matchline sense circuits of matchline sense circuitry block 160 will now be described with reference to the sequence diagram of FIG. 6 and the circuits shown in FIG. 5. The beginning of an arrow indicates the signal transition that causes an event, and the end of an arrow indicates the effect of the signal transition on another signal. During the precharge phase, PRE remains at the high logic level to hold all matchlines MLi, RML and all tail lines TLi, RTL at ground by turning on precharge transistors 170 and 172. PRE at the high logic level also turns on shorting transistor 164 to enable faster precharging of the matchlines MLi, RML to ground, and keeps signal EN at the low logic level via NOR gate 168, to turn off all current sources 162. While in the precharge phase, new data is asserted on the searchlines SLj/SLj*. With all matchlines and tail lines grounded and the current sources 162 turned off, all comparators 166 output a low logic level ML_OUTi signal. Similarly, comparator 166 from reference row 180 outputs a low logic level RML_OUT signal. PRE falls to the low logic level to start the active phase, and causes NOR gate 168 to generate a high logic level EN signal at first transition arrow 280. The high logic level EN signal turns on all current sources 162. Since precharge transistors 170, 172 and shorting transistors 164 are turned off when PRE falls to the low logic level, current source 162 raises the voltage potential of the reference matchline RML, as shown by second transition arrow 281, and matchlines MLi (not shown in FIG. 6). When the voltage potential of RML reaches a predetermined trip point reference voltage Vref, comparator circuit, 166 generates a high logic level RML_OUT signal as shown at third transition arrow 282. As a result of RML_OUT rising to the high logic level, NOR gate 168 generates a low logic level EN signal at fourth transition arrow 283, to turn off all current sources 162. Hence by the time RML_OUT rises to the high logic level, any matchline MLi having a match condition will also have generated a high logic level ML_OUTi signal, and any matchline MLi having a mismatch condition will have an ML_OUTi signal remaining at the precharged low logic level. At a predetermined time after EN falls to the low logic level and the active phase operation has been completed, PRE rises to the high logic level to recommence the precharge phase at fifth transition arrow 284, and all matchlines MLi, RML and tail lines TLi, RTL are connected to ground to reset the outputs of comparators 166 to the low logic level. It will be apparent to one skilled in the art that additional feedback logic may be added such that signal EN has some control over the precharge signal PRE.

For the circuit of FIG. 5 previously described above, during the search operation, matchlines remain at or near a VSS level except in the case of a match condition, as contrasted to other prior art approaches. Since matches have a lower probability than misses do, this new technique saves power.

Figure 1:
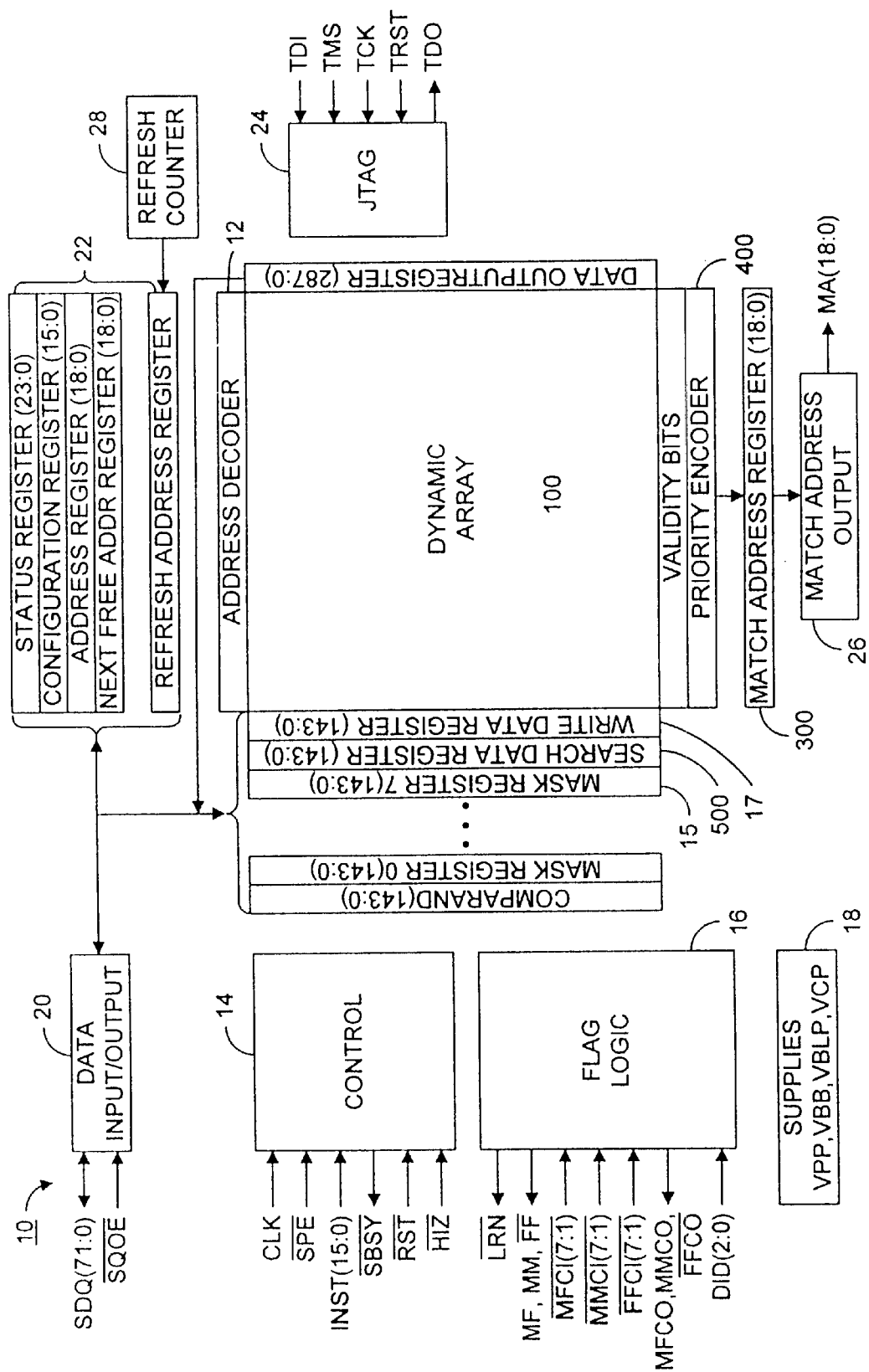
FIG. 1 shows a block diagram of a CAM according to an embodiment of the present invention.
Figure 2:
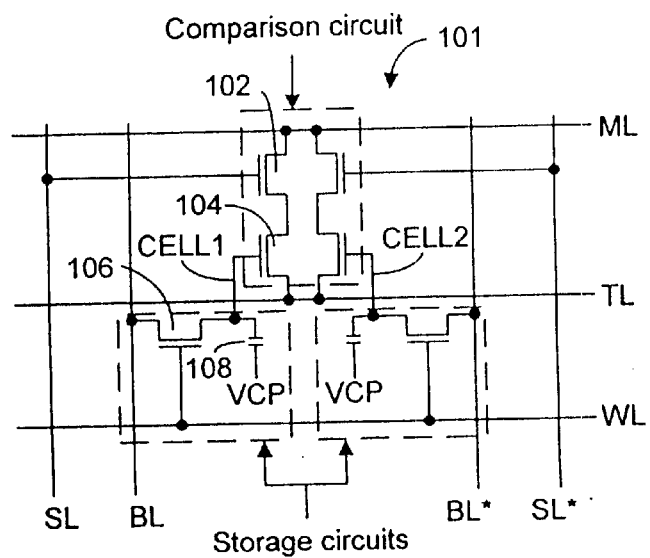
FIG. 2 shows a schematic of a DRAM based CAM cell.
Figure 3:
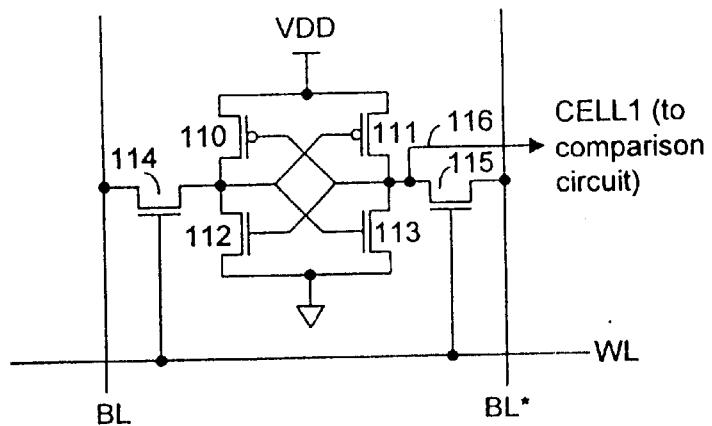
FIG. 3 shows a schematic of a prior art SRAM based CAM cell.
Figure 4:
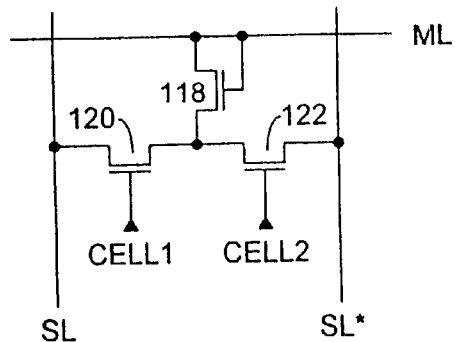
FIG. 4 shows a schematic of a prior art ternary search and compare circuit.
Figure 7:
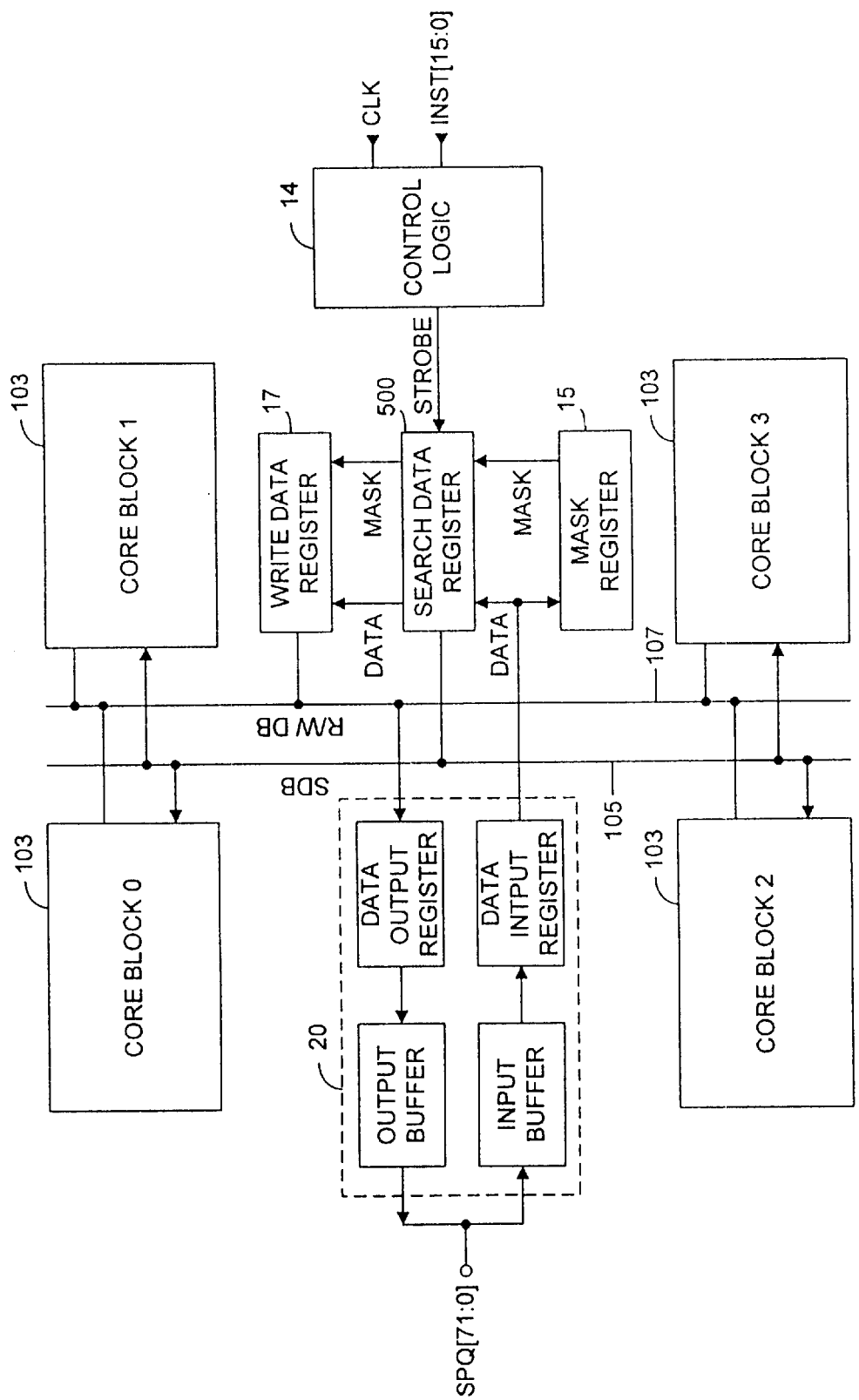
FIG. 7 shows a block diagram of the data access path of the CAM of FIG. 1.

FIG. 7 shows the functional blocks of the data access path and the array 100 of FIG. 1 in more detail. Array 100 is divided into four core blocks 103, each block connected to the search databus (SDB) 105, and the read-write databus (R/W_DB) 107. Data is input from, and output to, data pins SDQ[71:0] via data input/output block 20. The input path of data input/output block 20 consists of an input buffer and data input register, and the output path consists of an output buffer and data output register. Mask register 15 is connected to the input path of data input/output block 20 and produces mask data (MASK). The search data register 500 receives the mask data (MASK) from mask register 15, and the data signals (DATA) from the input path of data input/output block 20. The search data register 500 also receives a STROBE signal from control logic block 14 (not all control signals shown) and asserts the search data onto the search data bus (SDB) 105 during a search-and-compare operation. The search data register 500 includes many searchline control circuits, each circuit receiving one data bit and one mask bit for driving a pair of searchlines. Write data register 17 also receives input data (DATA) from the data input/output block 20 and the mask data (MASK) from mask register 15, and asserts write data onto the RIW databus 107 during a data write, or load, operation. The data output path is connected to the R/W databus 107 to read data from the arrays 103, although reading data from the CAM is seldomly done.

The general operation of a single searchline control circuit from search data register 500 is now described with reference to FIG. 7. The searchline control circuit receives a DATA and MASK signal and a common STROBE signal. Once data has been loaded into the memory via write data register 17, search-and-compare operations can proceed. For the search-and-compare operation, one bit from a search word is applied to its respective searchline control circuit through its DATA input. An active MASK bit is applied to disable the searchline control circuit from driving its respective pair of searchlines with the search data. A pulsed STROBE signal enables the searchline control circuit to latch the DATA and MASK signals. The STROBE signal is derived from the system clock CLK in control logic block 14 and the instruction INST[15:0] issued to the CAM device. In the search-and-compare operation, each searchline control circuit receiving an inactive MASK signal drives its respective searchline pair of with complementary data. In the cell arrangement of FIG. 5 for example, all CAM cells 101 of the same row then compare their stored contents with the search data on searchlines SLj and SLj*. Hence simultaneous comparison of a search data word against any stored data row of the core blocks 103 is possible.

Figure 8:
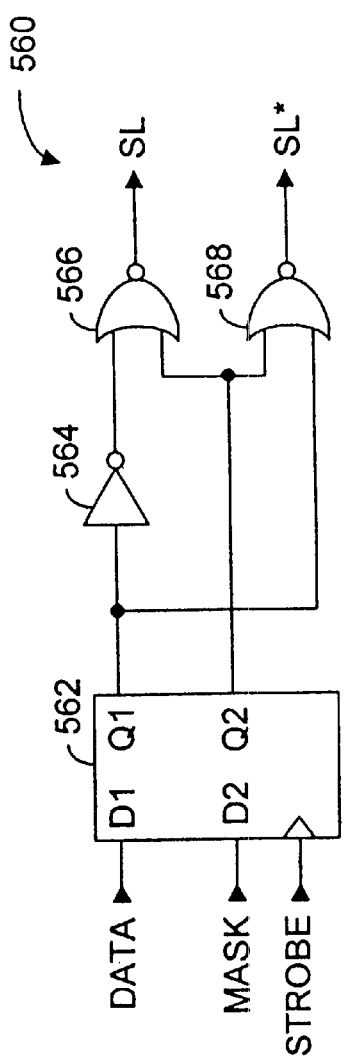
FIG. 8 shows a schematic of a prior art searchline control circuit.

For purposes of comparison and to provide a clearer understanding of the present invention, a description of a prior art searchline control circuit 560, as illustrated in FIG. 8, is first presented. Searchline control circuit 560 acts as a buffer for receiving searchline data and driving the searchline data on the searchlines SL and SL*. A latch circuit 562 receives DATA and MASK signals at inputs D1 and D2 respectively, and a STROBE signal at the clock input. If any bit of the search word is not required for comparison with stored words, then the MASK bit is set to the high logic level for that particular bit. Outputs Q1 and Q2 of the latch circuit 562 provide latched data corresponding to the inputs received at inputs D1 and D2 respectively. The output Q1 is connected directly to one input of a logic gate, NOR gate 568, while inverter 564 inverts the output from Q1 for one input of another logic gate, NOR gate 566. The second inputs of NOR gates 566 and 568 are connected in common to the output from Q2. NOR gates 566 and 568 are drivers which assert data onto searchlines SL and SL*. If DATA is in the "1" state, the SL is at the high logic level and SL* is at the low logic level. The logic level of each searchline SL and SL* is reversed if DATA is in the "0" state. However, if MASK is at the high logic level, then both searchlines SL and SL* are held at the low logic level. Latch circuit 562 has been implemented as a D-type edge-triggered flip-flop (DFF), which is well known in the art.

Figure 9:
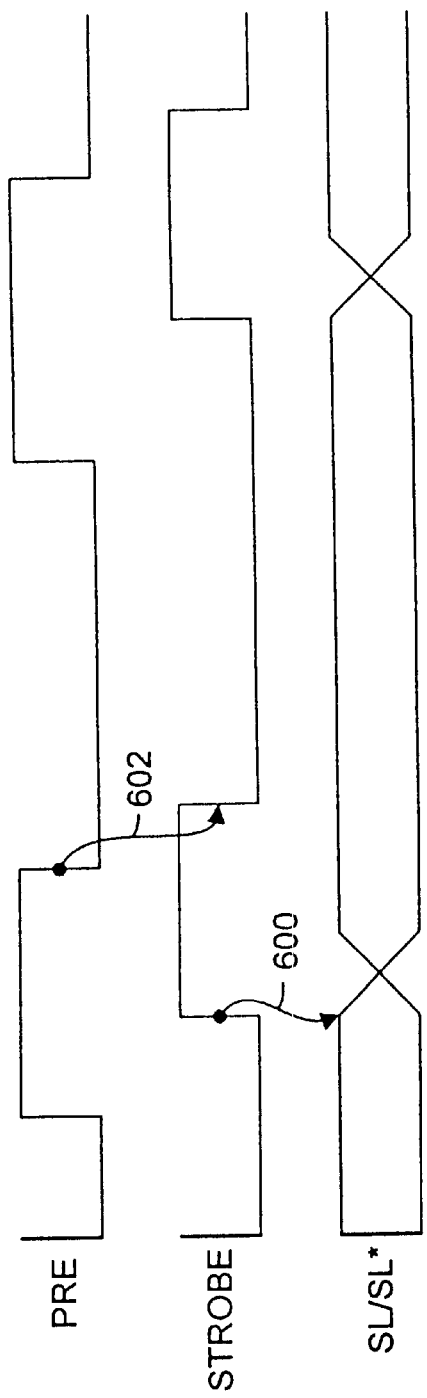
FIG. 9 shows a sequence diagram of the operation of the searchline control circuit of FIG. 8.

Referring to the sequence diagram of FIG. 9 and the circuit of FIG. 5, the prior art searchline control circuit 560 will now be described. The sequence diagram of FIG. 9 starts with PRE in the low logic level, near the end of the active phase of the previous search-and-compare operation. STROBE is at the low logic level and the searchline pair SL/SL* are maintained at one of the data states "0", "1" from the previous search-and-compare operation. Once PRE rises to the high logic level, the precharge phase begins and all matchlines are held at the ground level and the outputs of comparator circuits 166 from FIG. 5 are reset to the low logic level. At a predetermined time after PRE rises, the logic level of signal STROBE will also rise. New DATA and MASK bits are latched in DFF 562 on the rising edge of the STROBE signal which is timed to occur part-way through the precharge period, and the searchline pair SL/SL* is changed to another state at sixth transition arrow 600. PRE falls to the low logic level at seventh transition arrow 602, to end the precharge phase. By this time, all searchlines SLj–SLm have settled to their new states for matchline sensing to proceed when all current sources 162 are turned on. The STROBE signal falls to the low logic level at seventh transition arrow 602 as a result of PRE falling, to isolate inputs D1 and D2 of DFF 562 from the DATA and MASK signals. Hence, subsequent new DATA and MASK data can be applied without affecting the current search-and-compare operation. It should be noted that this circuit works equally well if the PRE signal is used to latch DATA and MASK, provided the control circuits provide sufficient setup time on the DATA and MASK signals.

Although power is saved because searchlines are not grounded in each precharge phase, changing data will charge and discharge the searchlines between ground and the power supply VDD. Therefore power consumption is still relatively high when using the circuit of FIG. 8.

Figure 10:
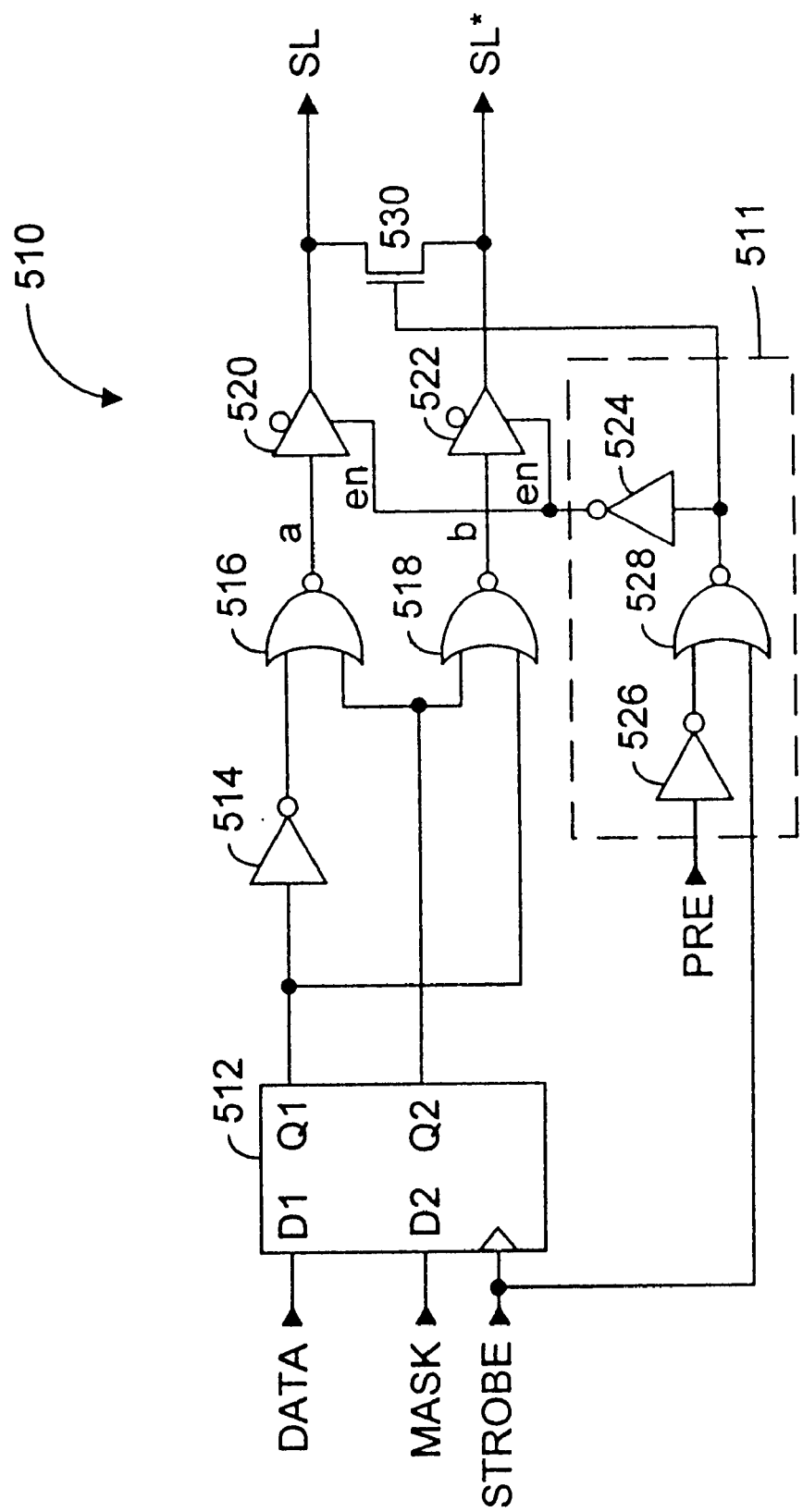
FIG. 10 shows a schematic of a searchline control circuit according to a first embodiment of the present invention.

A searchline control circuit 510 according to the present invention is shown in FIG. 10. This circuit incorporates many of the same elements as the circuit of FIG. 8, but includes an equalization circuit to reduce the amount of power consumed. Instead of continually driving the searchlines with data during the precharge phase, each pair of searchlines is shorted together by the equalization circuit to share charge between the searchline at VDD and the searchline at ground to equalize both searchlines to a midpoint voltage level of about VDD/2. The searchline control circuit of the present embodiment includes DFF 512, inverter 514 and NOR gates 516 and 518 which are configured identically to the corresponding elements 562, 564, 566 and 568, respectively, of FIG. 8. Selectively coupling circuits, such as tri-state buffers 520 and 522, connect output node a of NOR gate 516 to the searchline SL, and connect output node b of NOR gate 518 to the searchline SL*. Tri-state buffers 520 and 522 are turned off in response to signal en, to disconnect SL and SL* from the outputs of NOR gates 516 and 518 respectively. An equalization circuit such as n-channel shorting transistor 530 is connected between SL and SL*. Enabling circuit 511 consists of inverter 524 for generating signal en, NOR gate 528 and inverter 526. The output of NOR gate 528 is connected to the input of inverter 524 and the gate of shorting transistor 530. Shorting transistor 530 connected between SL and SL* equalizes the pair of searchlines in response to a high logic level output of NOR gate 528. NOR gate 528 receives the STROBE signal and the inverted PRE signal via inverter 526.

Figure 11:
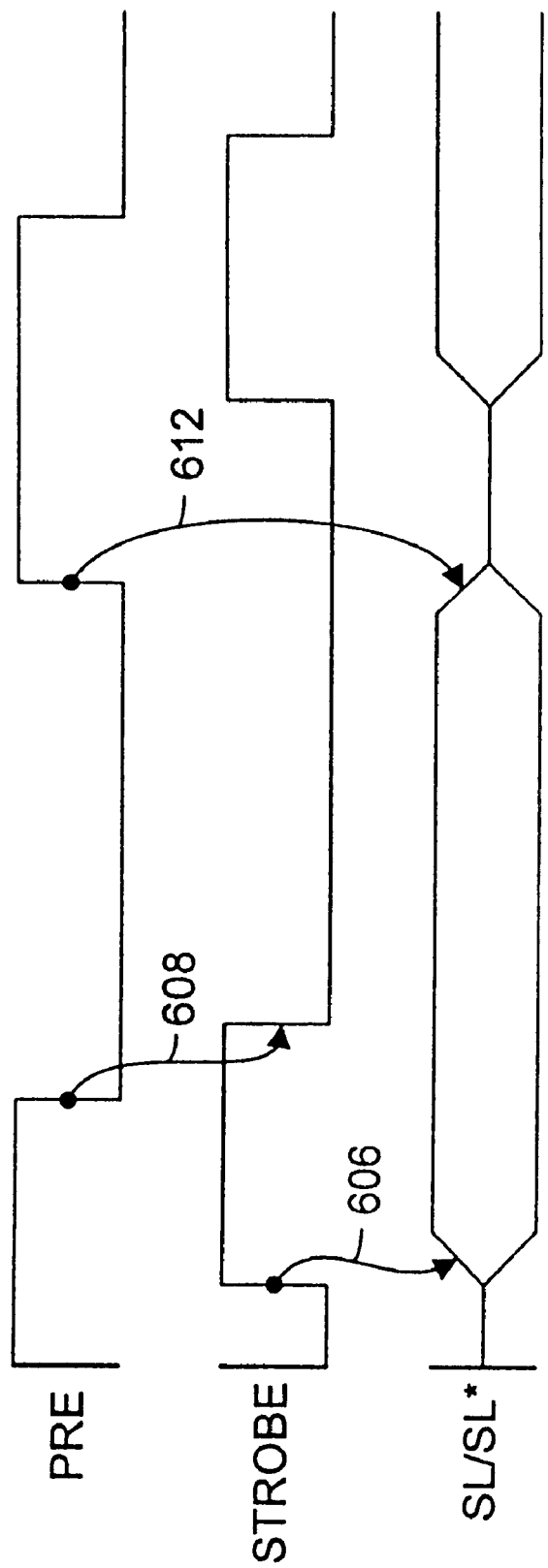
FIG. 11 shows a sequence diagram of the operation of the searchline control circuit of FIG. 10.

The operation of the searchline control circuit 510 is described below with reference to FIGS. 5, 6, 7, 10 and the sequence diagram of FIG. 11. The sequence diagram of FIG. 11 starts with PRE at the high logic level, initially keeping the searchline control circuit 510 in the precharge phase. STROBE is at the low logic level and the searchline pair SL/SL* are maintained at the precharge voltage level, which is discussed in further detail below. With PRE in the high logic level and STROBE in the low logic level, NOR gate 528 outputs a high logic level signal to turn on shorting transistor 530, and to turn off tri-state buffers 520 and 522. Hence each searchline of the searchline pair SL/SL* equalizes to approximately VDD/2 regardless of the logic levels appearing on nodes a and b during the precharge phase. The exception occurs when NOR gates 516 and 518 drive low logic levels onto both SL and SL* when the MASK bit is set to the high logic level. In this case, the searchline pair SL/SL* remain at ground. The high logic level PRE signal also keeps the matchline sense circuitry 160 in the precharge state, where all matchlines and tail lines are grounded, and all current sources 162 are turned off via the low logic level signal EN, as shown by second transition arrow 281 in FIG. 6 by example. The STROBE signal eventually rises to the high logic level at eighth transition arrow 606, latching new data on the DATA and MASK signal lines in DFF 512. The latched data is provided to NOR gates 516 and 518, and the appropriate logic levels are driven on the inputs of tri-state buffers 520 and 522. The high logic level STROBE signal is also received by NOR gate 528 to turn off shorting transistor 530. Tri-state buffers 520 and 522 are turned on for connecting the searchline pair to nodes a and b. In summary, the searchline pair SL/SL* are driven with data on the rising edge of the STROBE signal. To start the active phase, PRE falls to the low logic level at ninth transition arrow 608 to drive STROBE to the low logic level. Subsequently, in FIG. 5, the low logic level PRE signal generates a high logic level EN signal via NOR gate 168, to turn on all current sources 162 to begin the search-and-compare operation of matchline sense circuits 160. PRE, transitioning at ninth transition arrow 608, has no effect on the searchline control circuit 510 since search data is already present on the searchlines SL/SL*. Since PRE is at the low logic level, inverter 526 drives a high logic level on the input of NOR gate 528 to ensure that the output of NOR gate 528 remains at the low logic level after STROBE returns to the low logic level. This is to keep tri-state buffers 520, 522 turned on and the shorting transistor 530 turned off. Subsequently, PRE rises to the high logic level to end the active cycle at tenth transition arrow 612. Since both inputs to NOR gate 528 are at the low logic level, NOR gate 528 generates a high logic level signal to turn off tri-state buffers 520, 522 and to turn on shorting transistor 530. As a result, data on nodes a and b are isolated from searchlines SL and SL* while SL and SL* are shorted together and equalized to about VDD/2. The searchline control circuit 510 has thus entered the precharge phase, as indicated by tenth transition arrow 612.

In using the searchline control circuit 510, worst case searchline power consumption is halved compared to the prior art, because the VDD supply only needs to provide one half the charge to drive a searchline to the full VDD level versus a searchline which initially starts at ground.

Although the searchline control circuit 510 reduces worst case searchline power by half, it can waste power when the searchline data does not change from cycle to cycle, i.e. DATA and MASK bits do not change. If DATA and MASK bits do not change between previous and current search-and-compare operations, then the searchlines are unnecessarily precharged to VDD/2 and charged back to the previous data state. Therefore, significant power is consumed when multiple bits do not change over many successive search-and-compare operations.

Figure 12:
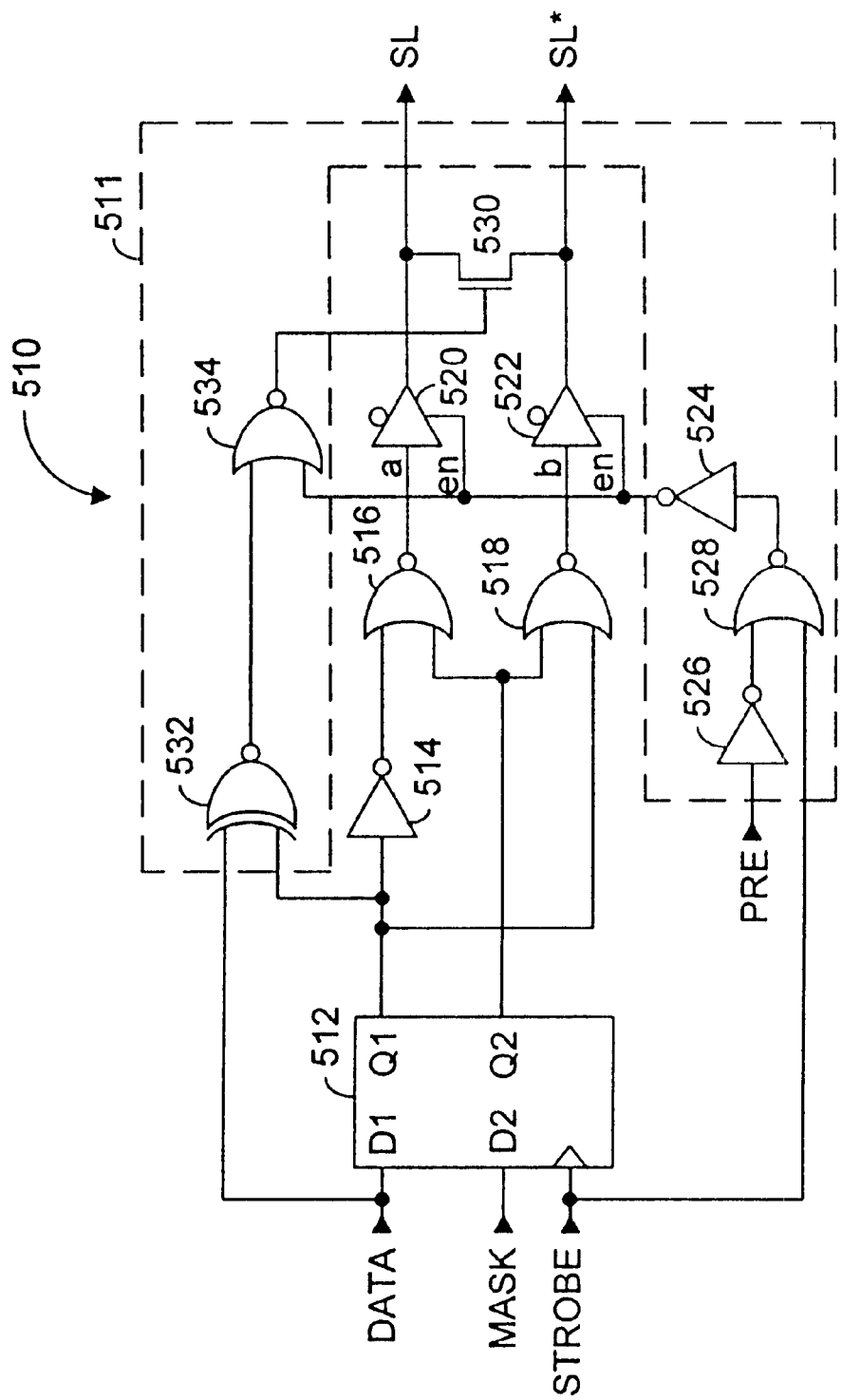
FIG. 12 shows a schematic of a searchline control circuit according to a further embodiment of the present invention.

Power consumption can be further reduced with the second embodiment of the searchline control circuit 510 of the present invention, shown in FIG. 12. Referring to FIGS. 5 and 12, additional logic has been incorporated into the enabling circuit 511 such that during operation, the searchlines are equalized only when the data latched from the previous search-and-compare operation is different from the new data for the current search-and-compare operation. An exclusive NOR (XNOR) gate 532 has one input connected to the DATA line, and another input connected to the latched output Q1. The output of XNOR gate 532 is connected to one input of NOR gate 534. The other input to NOR gate 534 is connected to en, the output of inverter 524. The gate of shorting transistor 530 is connected to the output of NOR gate 534 instead of NOR gate 528 as shown in FIG. 10.

The searchline control circuit 510 of FIG. 12 functions identically to the first illustrated embodiment if new data on the DATA line differs from the latched data presented on Q1 of DFF 512. In this case, XNOR gate 532 generates a low logic level signal and NOR gate 534 behaves as a simple inverter for inverting the output of inverter 524. This is logically equivalent to the operation of the first illustrated embodiment, where the output of NOR gate 528 is connected directly to the gate of shorting transistor 530. However, if the new data on the DATA line is the same as the latched data, then XNOR gate 532 generates a high logic level signal on the input of NOR gate 534. The resulting low logic level signal generated from NOR gate 534 turns off shorting transistor 530 to leave the searchline pair SL/SL* at their previous logic levels. The remaining input of NOR gate 534 connected to the output of inverter 524 is effectively "locked-out" from affecting the output of NOR gate 534 during the precharge phase. Therefore, when the new data is driven, little to no charge is added nor removed from the searchlines SL and SL*.

Figure 13:
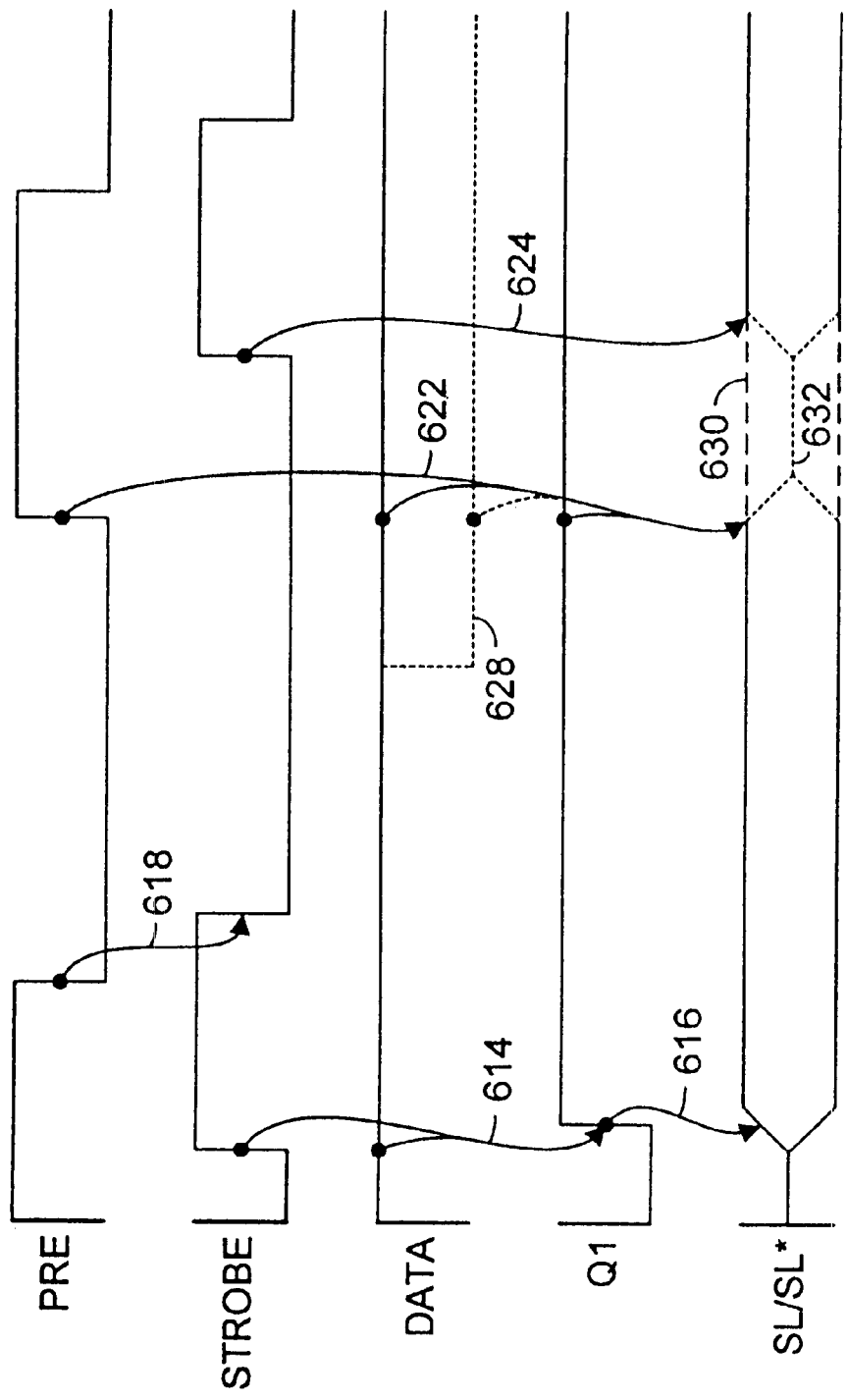
FIG. 13 shows a sequence diagram of the operation of the searchline control circuit of FIG. 12; and, FIG. 14 shows a schematic of a tri-state buffer for use in the circuits of FIGS. 10 and 12.

FIG. 13 is a sequence diagram illustrating the operation of the searchline control circuit 510 of FIG. 12 when the new data on the DATA line is the same as the latched data from the previous search-and-compare operation. Referring to FIGS. 5 and 12, in the initial state of the circuit, PRE is at the high logic level, initially keeping the searchline control circuit 510 in the precharge phase, and DATA is initially at the high logic level. On the rising edge of STROBE, DATA is sampled on input D1 of DFF 512, resulting in Q1 rising to the high logic level as shown by eleventh transition arrow 614. The high logic level STROBE signal turns off shorting transistor 530 and turns on tri-state buffers 520 and 522, allowing data on Q1 to be driven onto the searchline pair SL/SL* via NOR gates 516 and 518. This event is generally shown by twelfth transition arrow 616. PRE falls to the low logic level at thirteenth transition arrow 618 to drive STROBE to the low logic level, and to start the active phase. During the time between STROBE falling to the low logic level and PRE rising to the high logic level to start the next precharge phase of the next search-and-compare operation, DATA appearing on the D1 input of DFF 512 can change. In this example, DATA does not change, and remains at the high logic level. Since DATA and Q1 are at the same logic level, XNOR gate 532 drives an input of NOR gate 534 to the high logic level. It should be noted that while PRE is at the low logic level, inverter 524 drives the other input of NOR gate 534 to the high logic level, such that NOR gate 534 keeps shorting transistor 530 turned off. In other words, the output of XNOR gate 532 has no effect during the active phase, or while PRE remains at the low logic level.

The precharge phase begins at fourteenth transition arrow 622, when PRE rises to the high logic level. With both inputs to NOR gate 528 at the low logic level, NOR gate 528 generates a high logic level signal. The resulting low logic level signal from inverter 524 turns off tri-state buffers 520 and 522 to disconnect the outputs of NOR gates 516 and 518 from the searchline pair SL/SL*. Since the output of XNOR gate 532 is at the high logic level, the output from inverter 524 has no affect on the output of NOR gate 534. Hence precharging of the searchline pair SL/SL* is inhibited by keeping shorting transistor 530 turned off. The searchlines SL/SL* remain at their previously driven data states, as indicated by dashed lines 630. In the subsequent search-and-compare operation, STROBE rises at fifteenth transition arrow 624 to sample data from the DATA line, and the the searchlines SL/SL* are re-driven without any further addition or removal of charge from the searchlines. Therefore, significant power is saved, especially when multiple search bits do not change over successive search-and-compare-operations. Alternatively, as shown by dashed line 628, DATA can change to the low logic level. In this case, when PRE rises to the high logic level at fourteenth transition arrow 622, DATA and Q1 are not at the same logic levels. As a result, the output of XNOR gate 532 is set to the low logic level, enabling NOR gate 534 to generate a high logic level signal to turn on shorting transistor 530. The searchlines SL and SL* then equalize to about VDD/2 as shown by dashed lines 632.

Figure 14:
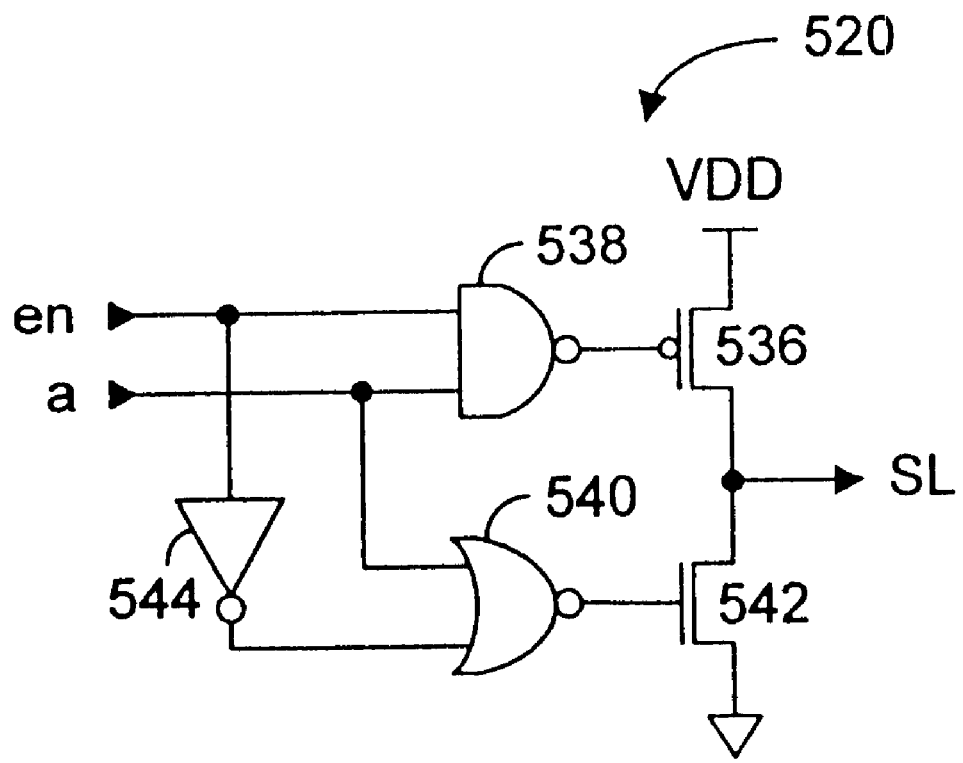

FIG. 14 is a circuit schematic of a typical tri-state buffer 520 for use in the searchline control circuits 510 shown in FIGS. 10 and 12. Although only one tri-state buffer circuit 520 is shown in FIG. 14 to couple node a to the searchline SL, an identical circuit is used to couple node b to the searchline SL*. The circuit includes a standard CMOS inverter consisting of p-channel transistor 536 and n-channel transistor 542 connected in series between VDD and ground for driving the searchline SL. The gate of p-channel transistor 536 is connected to the output of two-input NAND gate 538, which receives enable signal en and data from input node a. The gate of n-channel transistor 542 is connected to the output of two-input NOR gate 540, which receives data from input node a and the inverted enable signal via inverter 544.

In the operation of tri-state buffer 520, any logic level of a is driven onto the searchline SL when signal en is at the high logic level. NAND gate 538 and NOR gate 540 each behaves as a logical inverter for data signal a when en is at the high logic level. However, when en is at the low logic level, NAND gate 538 and NOR gate 540 output high and low logic level signals respectively, to turn off both p-channel transistor 536 and n-channel transistor 542. Hence SL can be electrically isolated from VDD and ground.

The following table summarizes power dissipation characteristics for the circuits of FIGS. 8, 10 and 12, under a worst case condition with data transitions every cycle, an average condition where there is a 50% probability of transition, and a best case condition where no transitions occur.

|  | Conditions | | |
| --- | --- | --- | --- |
|  | Worst | Nominal | Best |
| FIG. 8 (Prior Art) | P | P/2 | 0 |
| FIG. 10 (Unconditional precharge) | P/2 | P/2 | P/2 |
| FIG. 12 (Conditional precharge) | P/2 | P/4 | 0 |

As will be apparent to those of skill in the art, from the above table the searchline control circuits of the present invention, shown in FIGS. 10 and 12, provide significantly reduced power consumption characteristics when compared to the prior art circuit of FIG. 8, especially under the worst case condition. The circuit of FIG. 12 provides further power savings over the circuit of FIG. 10 under the nominal condition. The significant improvement in power consumption is achieved with a minimal increase in circuit components. Since the searchlines are precharged to a mid-point voltage level, the speed of the circuit is also improved when data is asserted.

While the preceding description of a searchline control circuit is made with reference to a DRAM-based CAM, it will be apparent to those of skill in the art that the circuits and techniques herein described can be equally applied to other CAM such as SRAM based CAM, to achieve similar power savings. Alternatively, a p-type transistor or a transmission gate can be used to short the searchlines SL and SL* to each other instead of the n-type transistor shown in the figures. Other clocked latch circuits can also be used in place of the D-type flip-flops shown in the figures. Tri-state buffers can be implemented as simple CMOS transmission gates, which are well known in the art. To save further power, the circuits of the present invention can be used in conjunction with circuits for precharging the searchlines to VDD/2 from ground when the searchlines are previously driven with the "don't care" state. Furthermore, an XNOR gate can be added to monitor the previous and present data states of the MASK bit, in the same way that the previous and present data states of the DATA bit is monitored, to selectively enable precharging of the searchlines. The circuit techniques described herein are also applicable where complementary signals are used, such as in data bus drive circuits, bitline drive circuits and address buffers for common memory devices.

The above-described embodiments of the invention are intended to be examples of the present invention. Alterations, modifications and variations may be effected the particular embodiments by those of skill in the art, without departing from the scope of the invention which is defined solely by the claims appended hereto.

We claim:

1. A control circuit for reducing power consumption in first and second signal lines used in semiconductor device, comprising;
    a data buffer for driving data on the first and second signal lines;
    first and second coupling circuits for disconnecting the first and second signal lines, respectively, from the data buffer in response to an enable signal; and
    an equalizing circuit for shorting the first and second signal lines together in response to the enable signal.

2. The control circuit of claim 1, wherein the data buffer includes,
    a latch circuit for receiving a data signal, a mask signal and a control signal, the latch circuit latching and producing in response to the control signal, a first output and a second output; and
    a drive circuit for receiving the first output and the second output, and for generating data on the first and second signal line.

3. The control circuit of claim 2, wherein the drive circuit includes,
    a first logic gate receiving the first output and the second output, for generating a first data logic level on the first signal line; and
    a second logic gate receiving an inverted first output and the second output, for generating a second data logic level on the second signal line.

4. The control circuit of claim 1, wherein the first and second coupling circuits are tri-state buffers.

5. The control circuit of claim 1, wherein the first and second coupling circuits are transmission gates.

6. The control circuit of claim 1, wherein the equalizing circuit includes,
    a transistor; and
    a logic circuit for generating the enable signal.

7. The control circuit of claim 6, wherein the transistor is an n-type transistor.

8. The control circuit of claim 6, wherein the transistor is a p-type transistor.

9. A control circuit for reducing searchline power consumption in a content addressable memory, comprising;
    a flip-flop for receiving search data and providing first and second search data outputs;
    a coupling circuit for coupling the first and second search data outputs to first and second searchlines respectively;
    an enabling circuit for selectively enabling the coupling circuit to pass the first and second search data outputs to the first and second searchlines in response to a precharge signal; and
    an equalizing circuit for connecting the first and second searchlines together in response to the precharge signal.

10. The control circuit of claim 9, wherein the flip-flop is a D-type flip-flop, the D-type flip-flop also receiving mask data and a clock signal, for latching the search data and the mask data and providing the first and second search data outputs respectively in response to a rising edge of the clock signal.

11. The control circuit of claim 9, wherein the coupling circuit includes:
    a first logic gate for receiving the first and second search data outputs for generating a first intermediate search data output;
    a second logic gate receiving an inverted first search data output and the second search data output for generating a second intermediate search data output;
    first and second buffers for selectively coupling the first and second intermediate search data outputs to the first and second searchlines respectively.

12. The control circuit of claim 11, wherein the first and second buffers are tri-state buffers.

13. The control circuit of claim 9, wherein the first and second buffers are transmission gates.

14. The control circuit of claim 9, wherein the equalizing circuit is comprised of an equalizing transistor.

15. The control circuit of claim 14, wherein the equalizing transistor is an n-type transistor.

16. The control circuit of claim 14, wherein the equalizing transistor is a p-type transistor.

17. The control circuit of claim 9, wherein the enabling circuit includes a logic circuit for receiving the search data and the first search data output to enable the equalizing circuit, in response to the precharge signal, when the search data and the first search data output are different.

18. A content addressable memory comprising:
    an array of content addressable memory cells arranged in rows and columns;
    an address decoder for addressing rows of cells;
    write data circuitry for writing data to the cells;
    search data circuitry for writing search data onto pairs of searchlines;
    matchline sense circuitry for comparing the data stored in the cells with to the search data on the pairs of searchlines; and
    a searchline control circuit for selectively equalizing the pairs of searchlines during a precharge phase.

19. The content addressable memory of claim 18, wherein the matchline sense circuitry matchlines and tail lines are equalized during the precharge phase.

20. A control circuit for reducing searchline power consumption in a content addressable memory, comprising;

a flip flop for latching a search data signal and a mask data signal in response to a clock signal, and for providing first and second search data outputs;

a first inverter for receiving the first search data output to provide an inverted search data output;

a first logic gate for receiving the inverted search data output and the second search data output to provide a first intermediate search data output;

a second logic gate for receiving the first search data output and the second search data output to provide a second intermediate search data output;

a third logic gate for receiving the clock signal and a precharge signal to provide an equalization signal;

a second inverter receiving the equalization signal and providing an enable signal;

a first buffer circuit for selectively coupling the first intermediate search data output to a first searchline in response to the enable signal;

a second buffer circuit for selectively coupling the second intermediate search data output to a second searchline in response to the enable signal; and a transistor having a source connected to the first searchline, a drain connected to the second searchline, and a gate connected to the equalization signal.

21. The control circuit of claim 20, wherein the first and second logic gates are NOR gates.

22. The control circuit of claim 20, wherein the first and second buffer circuits are tristate buffers.

23. The control circuit of claim 20, wherein the first and second buffer circuits are transmission gates.

24. The control circuit of claim 20, wherein the transistor is an n-type transistor.

25. The control circuit of claim 20, wherein the transistor is a p-type transistor.

26. A method for precharging first and second complementary signal lines in a content addressable memory; comprising the steps of:

(i) latching search data during a precharge cycle;

(ii) driving the first and second complementary signal lines with the latched search data during an active cycle; and (iii) equalizing the first and second complementary signal lines before latching new search data in a subsequent precharge cycle.

27. The method of claim 26, wherein the first and second complementary signal lines are driven to complementary data logic levels.

28. The method of claim 26, wherein the first and second signal lines are driven to the same logic levels.

29. The method of claim 26, wherein the first and second complementary signal lines remain are equalized to a midpoint voltage level between a high logic voltage level and a low logic voltage level.

30. The method of claim 29, wherein the high logic voltage level is VDD and the low logic voltage level is ground.

31. The method of claim 26, wherein equalization of the first and second complementary signal lines is disabled when the search data and the new search data are at the same logic levels.

32. A control circuit for reducing searchline power consumption in a content addressable memory, comprising;

a flip flop for latching a search data signal and a mask data signal in response to a clock signal, and for providing first and second search data outputs;

a first inverter for receiving the first search data output to provide an inverted first search data output;

a first logic gate receiving the inverted first search data output and the second search data output to provide a first intermediate search data output;

a second logic gate receiving the first search data output and the second search data output to provide a second intermediate search data output;

a third logic gate for receiving the clock signal and a precharge signal to provide an intermediate control signal;

a second inverter receiving the intermediate control signal and providing an enable signal;

a first buffer circuit for selectively coupling the first intermediate search data output to a first searchline in response to the enable signal;

a second buffer circuit for selectively coupling the second intermediate search data output to a second searchline in response to the enable signal;

a fourth logic gate for receiving the search data and the first search data output, to provide a second intermediate control signal;

a fifth logic gate for receiving the second intermediate control signal and the enable signal, to provide an equalization signal; and a transistor having a source connected to the first searchline, a drain connected to the second searchline, and a gate connected to the equalization signal.

33. A control circuit for reducing searchline power consumption in a content addressable memory, comprising;

a flip-flop for receiving search data and providing first and second search data outputs;

a coupling circuit for coupling the first and second search data outputs to first and second searchlines respectively;

an enabling circuit for selectively enabling the coupling circuit to pass the first and second search data outputs to the first and second searchlines in response to a precharge signal;

an equalizing circuit connected between the first and second searchlines; and a logic circuit for receiving the search data and the first search data output to enable the equalizing circuit, in response to the precharge signal, when the search data and the first search data output are different.

34. The control circuit of claim 33, wherein the logic circuit disables the equalizing circuit when the search data and the first search data output are the same.

* * * * *